(12) United States Patent
Zuo et al.

(10) Patent No.: US 12,721,213 B2
(45) Date of Patent: Aug. 25, 2026

(54) SEMICONDUCTOR DEVICE AND METHOD OF FORMING CHANNELS IN ENCAPSULANT TO REDUCE WARPAGE IN RECONSTITUTED WAFER

(71) Applicant: STATS ChipPAC Pte. Ltd., Singapore (SG)

(72) Inventors: Jian Zuo, Singapore (SG); Lee Sun Lim, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 377 days.

(21) Appl. No.: 18/323,594

(22) Filed: May 25, 2023

(65) Prior Publication Data

US 2024/0395647 A1 Nov. 28, 2024

(51) Int. Cl.

*H10W 70/60* (2026.01)
*B23K 26/38* (2014.01)
*H10W 74/01* (2026.01)
*H10W 74/10* (2026.01)
*B23K 101/40* (2006.01)
*H10W 72/20* (2026.01)
*H10W 72/90* (2026.01)

(52) U.S. Cl.

CPC .......... *H10W 74/117* (2026.01); *B23K 26/38* (2013.01); *H10W 74/016* (2026.01); *H10W 74/019* (2026.01); *B23K 2101/40* (2018.08); *H10W 70/60* (2026.01); *H10W 72/241* (2026.01); *H10W 72/9413* (2026.01)

(58) Field of Classification Search

CPC ...... H01L 24/04; H01L 23/3128; H01L 24/12
See application file for complete search history.

(56) References Cited

U.S. PATENT DOCUMENTS 9,484,227 B1 * 11/2016 Cheng ................ H10W 74/117
9,721,862 B2 8/2017 Han et al.
2013/0341800 A1 * 12/2013 Tu ........................ H01L 23/585 257/774
2016/0351462 A1 12/2016 Kuan et al.

* cited by examiner

*Primary Examiner* — Trang Q Tran
(74) *Attorney, Agent, or Firm* — Brian M. Kaufman; Robert D. Atkins; PATENT LAW GROUP: Atkins and Associates, P.C.

(57) ABSTRACT

A semiconductor device has a plurality of electrical components and an encapsulant deposited over the electrical components. A first saw street of the encapsulant separates a first electrical component from a second electrical component. A first channel is formed in a first surface of the encapsulant within the first saw street to reduce stress. A second channel is formed in a second surface of the encapsulant opposite the first surface and within the first saw street. A third channel is formed in the first surface of the encapsulant and within a second saw street of the encapsulant normal to the first saw street. An RDL is formed over the electrical components. The RDL has an insulating layer formed over the electrical component, and a conductive layer formed over the insulating layer. The insulating layer terminates prior to the first saw street.

17 Claims, 9 Drawing Sheets

180
134b
134a
166
152
140
150
164
104
130b
170
158
112
140
144c
144b
144a
130a
160
150

SEMICONDUCTOR DEVICE AND METHOD OF FORMING CHANNELS IN ENCAPSULANT TO REDUCE WARPAGE IN RECONSTITUTED WAFER

FIELD OF THE INVENTION

The present invention relates in general to semiconductor devices and, more particularly, to a semiconductor device and method of forming channels in the encapsulant to reduce warpage in a reconstituted WLP.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices often contain a semiconductor die or substrate with electrical interconnect structures, e.g., redistribution layers (RDL) formed over one or more surfaces of the semiconductor die or substrate to perform necessary electrical functions. The semiconductor devices are formed on wafers or panels, such as molded reconstituted wafer level package (WLP). The wafers and panels are subject to cracking due to the propagation of thermal stress, delamination, and warping displacement contributed by one or more expansive metal layers during formation of the RDL. Larger fan-out devices have a higher risk of cracking and, consequently, lower yield leading to higher manufacturing costs. The warpage is detrimental to process yield especially for larger wafer size, larger package size, and multilayer RDL layer fan-out units, which results from higher thermal stress throughout the fabrication processes. In addition, the package molding compound can cause crease warping of the wafer due to mismatched coefficient of thermal expansion (CTE).

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
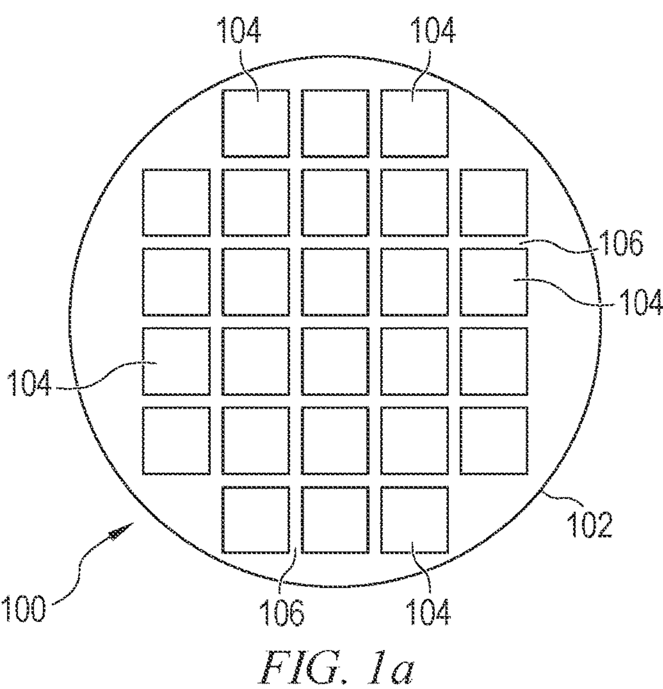
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
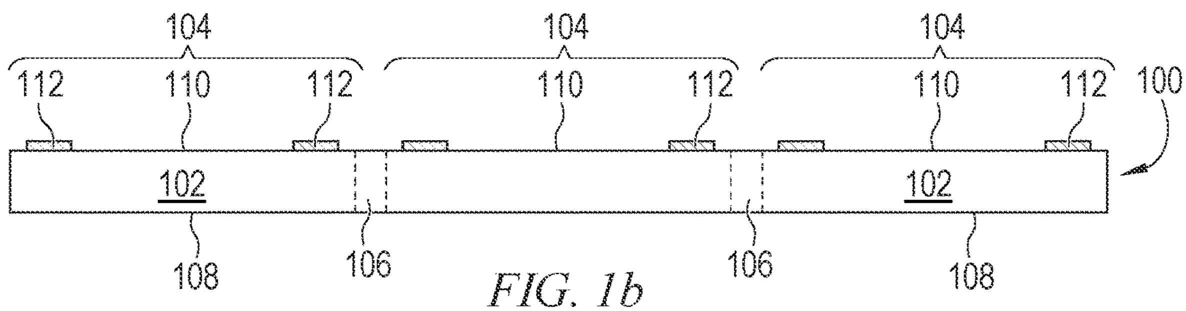

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
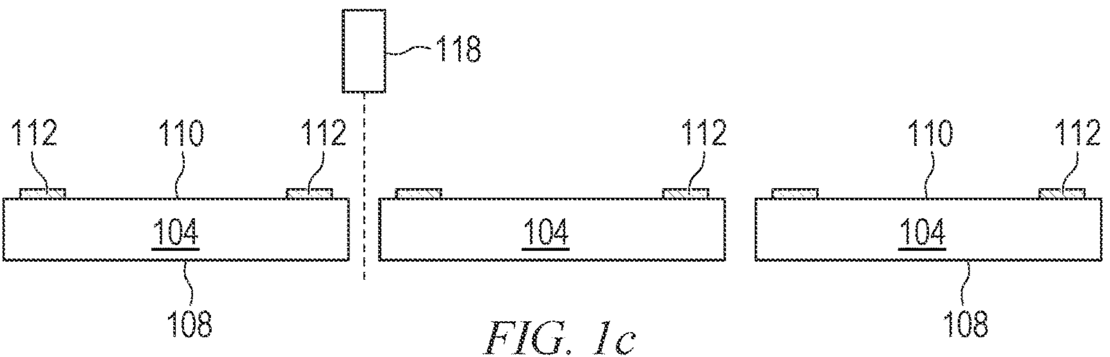

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2A:
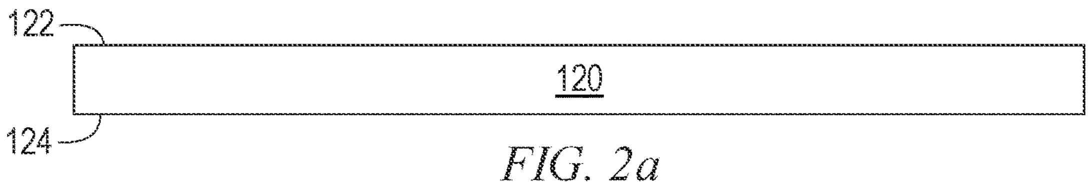
FIGS. 2*a*-2*i* illustrate a process of forming channels in the encapsulant of a reconstituted WLP.
Figure 2B:
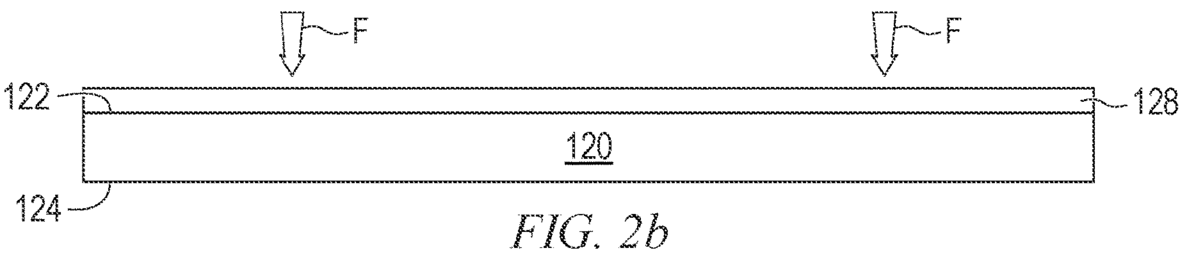

FIG. 2*a* shows a temporary substrate or carrier 120 containing sacrificial base material, such as silicon, polymer, beryllium oxide, glass, or other suitable low-cost, rigid material for structural support. Substrate 120 has major surface 122 and major surface 124, opposite surface 122. In one embodiment, carrier 120 is a support structure with a temporary bonding layer 128 formed over the carrier, as in FIG. 2*b*. Temporary bonding layer 128 can be a film or foil bonded to surface 122 by application of force F.

Figure 2C:
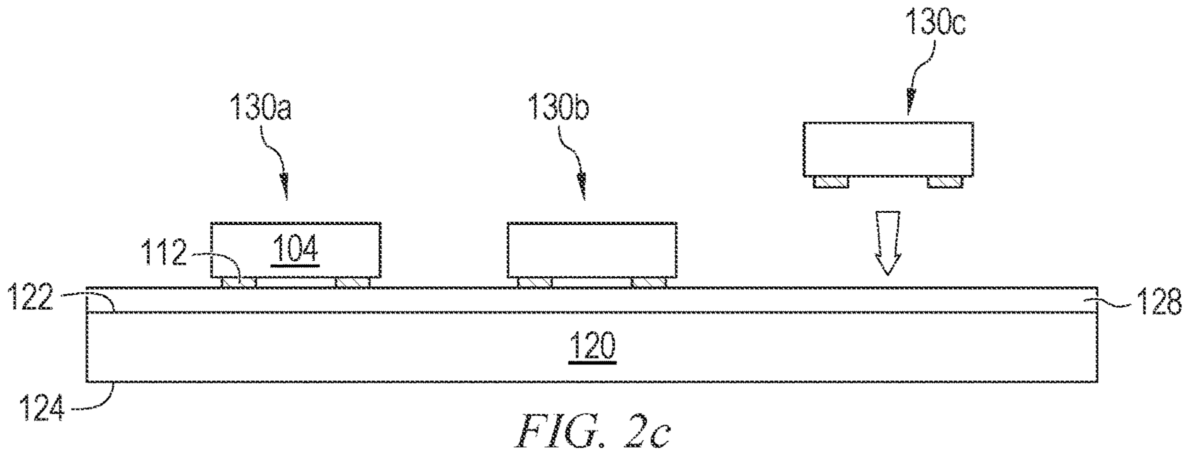

In FIG. 2*c*, electrical components 130*a*-130*c* are disposed on surface 122 of substrate 120. Electrical components 130*a*-130*c* can be similar to, or made similar to, semiconductor die 104 from FIG. 1*c* with conductive layer 112 oriented toward surface 122 of substrate 120. Alternatively, electrical components 130*a*-130*c* can include other semiconductor die, semiconductor packages, surface mount devices, RF components, discrete electrical devices, or integrated passive devices (IPD).

Figure 2D:
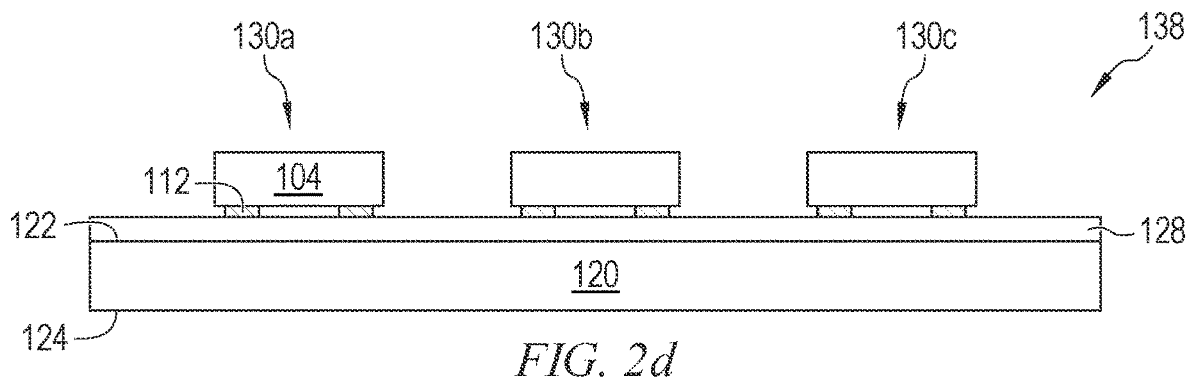
Figure 2E:
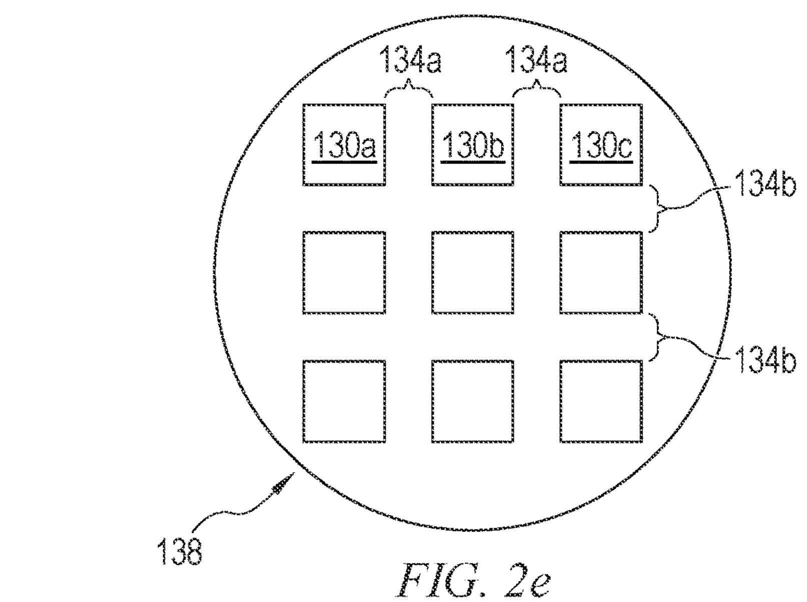

Electrical components 130*a*-130*c* are positioned over substrate 120 using a pick and place operation. Electrical components 130*a*-130*b* are brought into contact with bonding layer 128. FIG. 2*d* illustrates electrical components 130*a*-130*c* bonded to substrate 120, as a reconstituted wafer level package (WLP) 138. FIG. 2*e* is a top view of reconstituted WLP 138 with electrical components 130*a*-130*c* bonded to substrate 120. Electrical components 130*a*-130*c* are positioned with a saw street or dicing channels 134*a* and 134*b* located between the components.

Figure 2F:
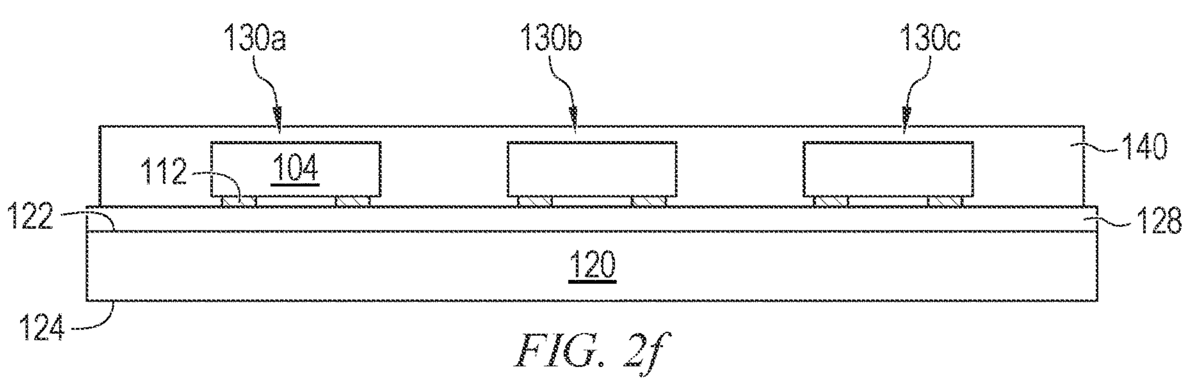

In FIG. 2*f*, encapsulant or molding compound 140 is deposited over and around electrical components 130*a*-130*c* and substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin with filler, epoxy acrylate with filler, or polymer with proper filler. Encapsulant 140 is non-conductive, provides structural support, and environmentally protects the semiconductor device from external elements and contaminants.

Figure 2G:
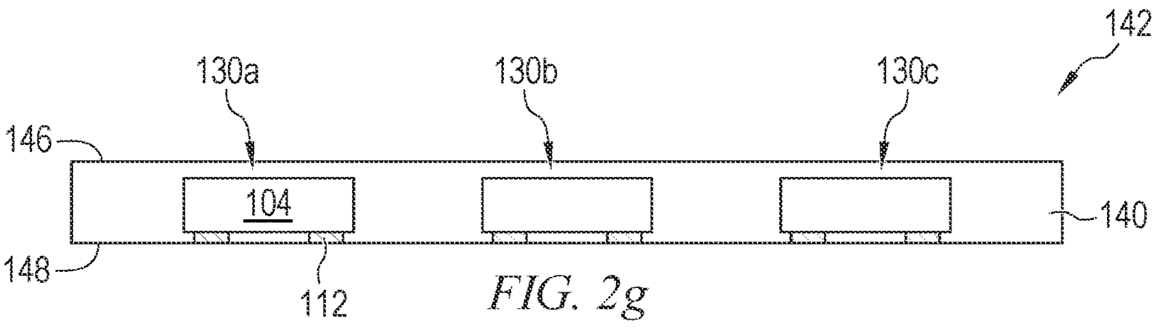

In FIG. 2*g*, carrier 120 and bonding layer 128 are removed by chemical etching, chemical mechanical polishing (CMP), mechanical peel-off, mechanical grinding, thermal bake, ultra-violet (UV) light, or wet stripping to expose conductive layer 112 and surface 148 of encapsulant 140. Reconstituted WLP 142, comprising electrical components 130*a*-130*c* and encapsulant 140, is ready for a multi-layer RDL buildup interconnect structure over surface 110 of electrical component 130*a*-130*c*, surface 148 of encapsulant 140, and conductive layer 112 to provide electrical interconnect for the semiconductor die, as well as external electrical components. Reconstituted WLP 142 operates as a substrate to form the multi-layer RDL buildup interconnect structure.

Figure 2H:
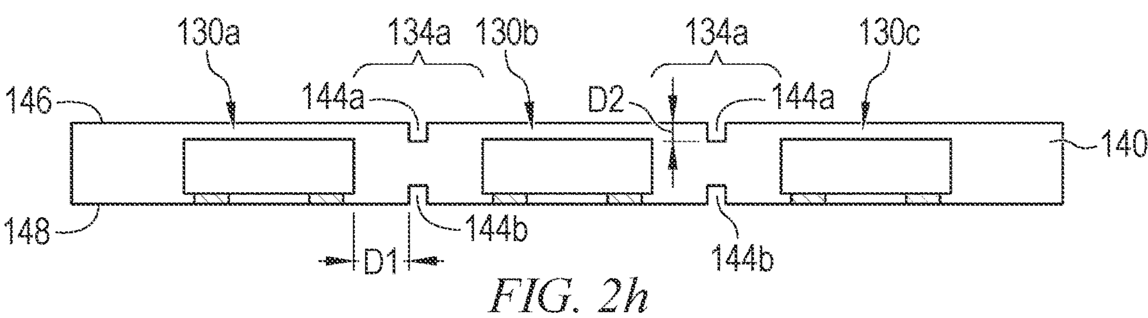
Figure 2I:
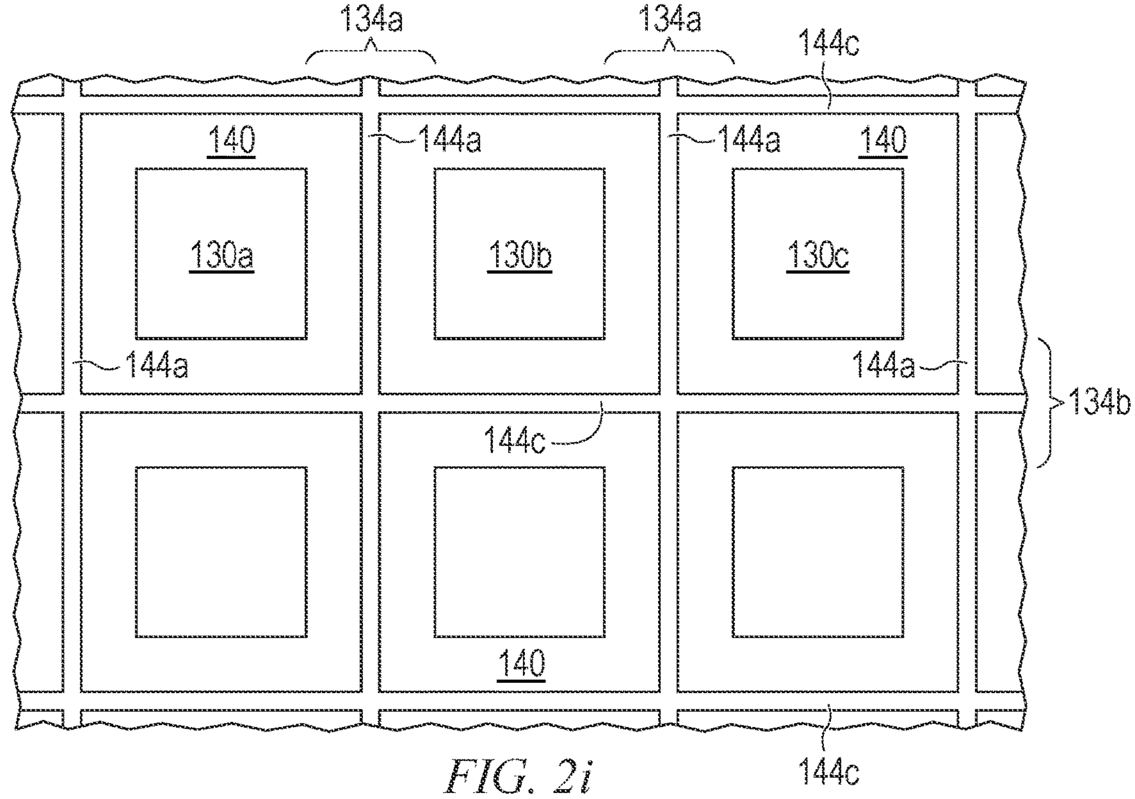

In FIG. 2*h*, channels or grooves 144*a* are formed in surface 146 of encapsulant 140 and within saw streets 134*a*. Channels or grooves 144*b* are formed in surface 148 of the encapsulant and within saw streets 134*a*. Hence, channels 144*a* and 144*b* are formed in opposite surfaces 146 and 148 of encapsulant 140. Channels 144*a* and 144*b* are formed a distance D1 of 50 micrometers (μm) minimum from electrical components 130*a*-130*c*, within saw streets 134*a*. Channels 144*a*-144*b* can be formed by an etching process, laser direct ablation (LDA), or dicing blade to a depth D2 of 15 μm minimum. FIG. 2*i* is a top view of channel 144*a* formed in surface 146 of encapsulant 140 and within saw streets 134*a*. In a similar manner, channel, or groove 144*c* is formed in surface 146 of encapsulant 140 and within saw streets 134*b* by an etching process, LDA, or dicing blade to a depth D2, in a direction normal to channel 144*a*.

Figure 3A:
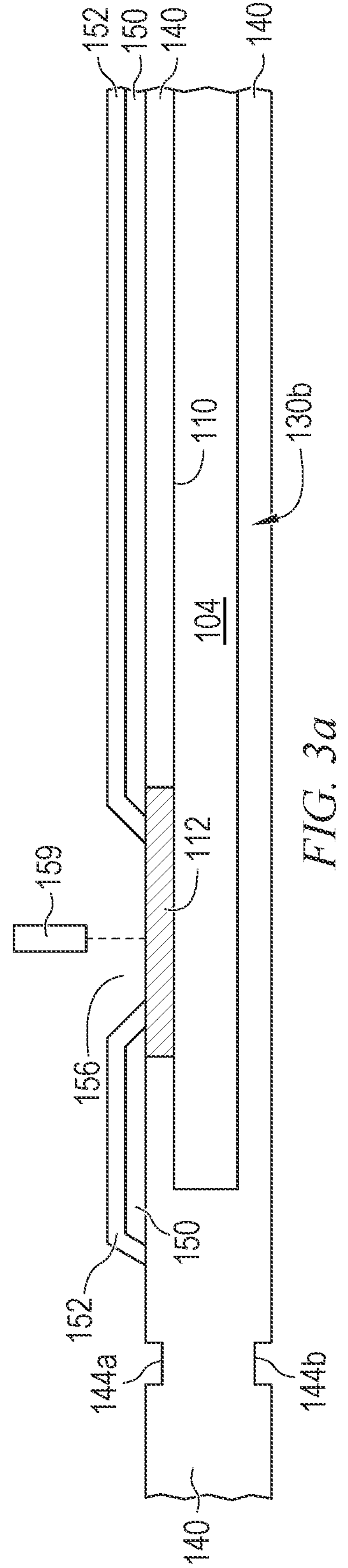
FIGS. 3*a*-3*c* illustrate a process of forming multi-layer RDL on the reconstituted WLP.
Figure 3B:
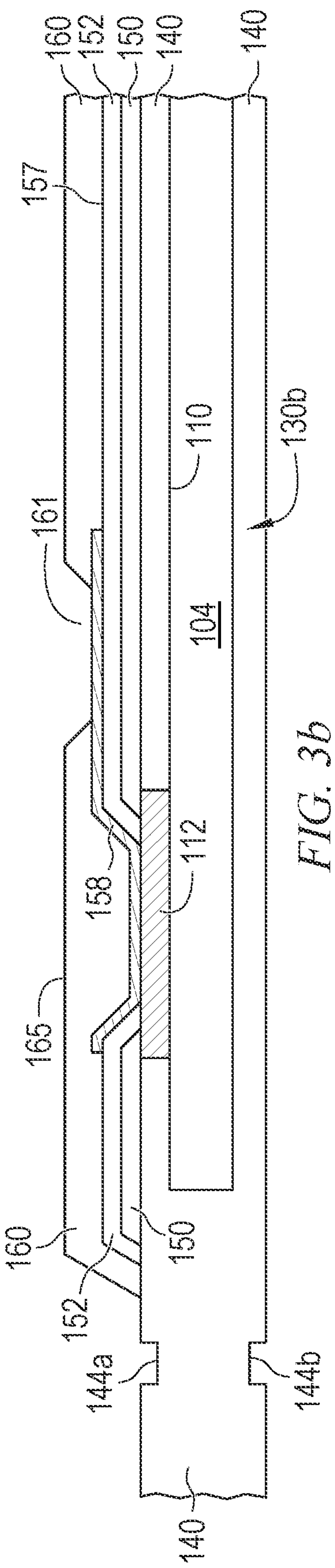
Figure 3C:
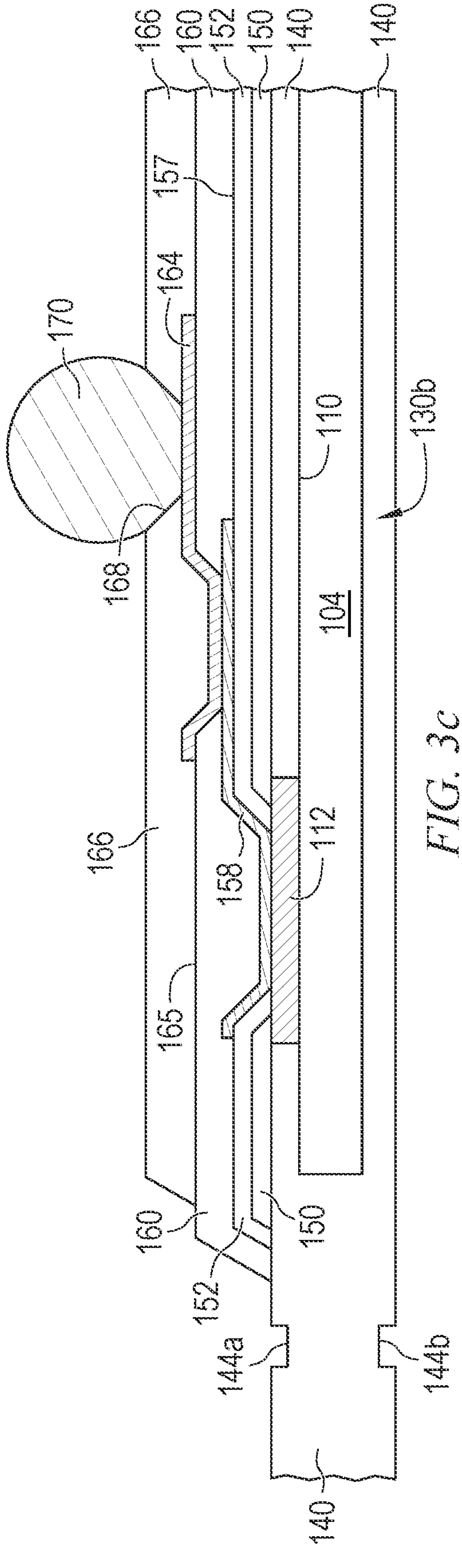

FIGS. 3*a*-3*c* illustrate a portion of electrical component 130*b* and formation of a multi-layer buildup interconnect structure. In FIG. 3*a*, insulating or passivation layer 150 is formed over surface 146 and conductive layer 112 using PVD, CVD, printing, lamination, spin coating, spray coating, sintering or thermal oxidation. Insulating layer 150 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties.

An insulating or passivation layer 152 is formed over insulating layer 150 using PVD, CVD, printing, lamination, spin coating, spray coating, sintering or thermal oxidation. Insulating layer 152 contains one or more layers of SiO2, Si3N4, SiON, Ta2O5, Al2O3, solder resist, polyimide, BCB, PBO, and other material having similar insulating and structural properties. Portions of insulating layers 150 and 152 are removed using an etching process or LDA using laser 159 to form openings or vias 156 extending to conductive layer 112 for further electrical interconnect, such as the multi-layer RDL buildup structures.

In FIG. 3*b*, conductive layer 158 is formed over surface 157 of insulating layer 152 and into vias 156 using PVD, CVD, electrolytic plating, electroless plating process, or other suitable metal deposition process. Conductive layer 158 can be one or more layers of Al, Cu, Sn, Ni, Au, Ag, or other suitable electrically conductive material. Conductive layer 158 is an RDL as it redistributes the electrical signal across and over semiconductor die 104 and encapsulant 140. Portions of conductive layer 158 can be electrically common or electrically isolated depending on the design and function of semiconductor die 104 and other electrical components attached thereto.

An insulating or passivation layer 160 is formed over insulating layer 152 and conductive layer 158 using PVD, CVD, printing, lamination, spin coating, spray coating, sintering or thermal oxidation. Insulating layer 160 contains one or more layers of SiO2, Si3N4, SiON, Ta2O5, Al2O3, solder resist, polyimide, BCB, PBO, and other material having similar insulating and structural properties. Portions of insulating layer 160 are removed using an etching process or LDA using a laser like 159 to form openings or vias 161 extending to conductive layer 158 for further electrical interconnect, such as the multi-layer RDL buildup structures. Insulating layers 152 and 160 provide isolation around conductive layer 158.

In FIG. 3*c*, conductive layer 164 is formed over surface 165 of insulating layer 160 and into vias 161 using PVD, CVD, electrolytic plating, electroless plating process, or other suitable metal deposition process. Conductive layer 164 can be one or more layers of Al, Cu, Sn, Ni, Au, Ag, or other suitable electrically conductive material. Conductive layer 164 is an RDL as it redistributes the electrical signal across and over semiconductor die 104, encapsulant 140, and conductive layer 158. Portions of conductive layer 164 can be electrically common or electrically isolated depending on the design and function of semiconductor die 104 and other electrical components attached thereto.

An insulating or passivation layer 166 is formed over insulating layer 160 and conductive layer 164 using PVD, CVD, printing, lamination, spin coating, spray coating, sintering or thermal oxidation. Insulating layer 166 contains one or more layers of SiO2, Si3N4, SiON, Ta2O5, Al2O3, solder resist, polyimide, BCB, PBO, and other material having similar insulating and structural properties. Portions of insulating layer 166 are removed using an etching process or LDA using a laser like 159 to form openings or vias 168 extending to conductive layer 164 for further electrical interconnect, such as the multi-layer RDL buildup structures or interconnect bumps. Insulating layers 160 and 166 provide isolation around conductive layer 164.

An electrically conductive bump material is deposited over conductive layer 164 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 164 using a suitable attachment or bonding process. In one embodiment, the bump material is reflowed by heating the material above its melting point to form balls or bumps 170. In one embodiment, bump 170 is formed over an under bump metallization (UBM) having a wetting layer, barrier layer, and adhesive layer. Bump 170 can also be compression bonded or thermocompression bonded to conductive layer 164. Bump 170 represents one type of interconnect structure that can be formed over conductive layer 164. The interconnect structure can also use bond wires, conductive paste, stud bump, micro bump, or other electrical interconnect.

Figure 4A:
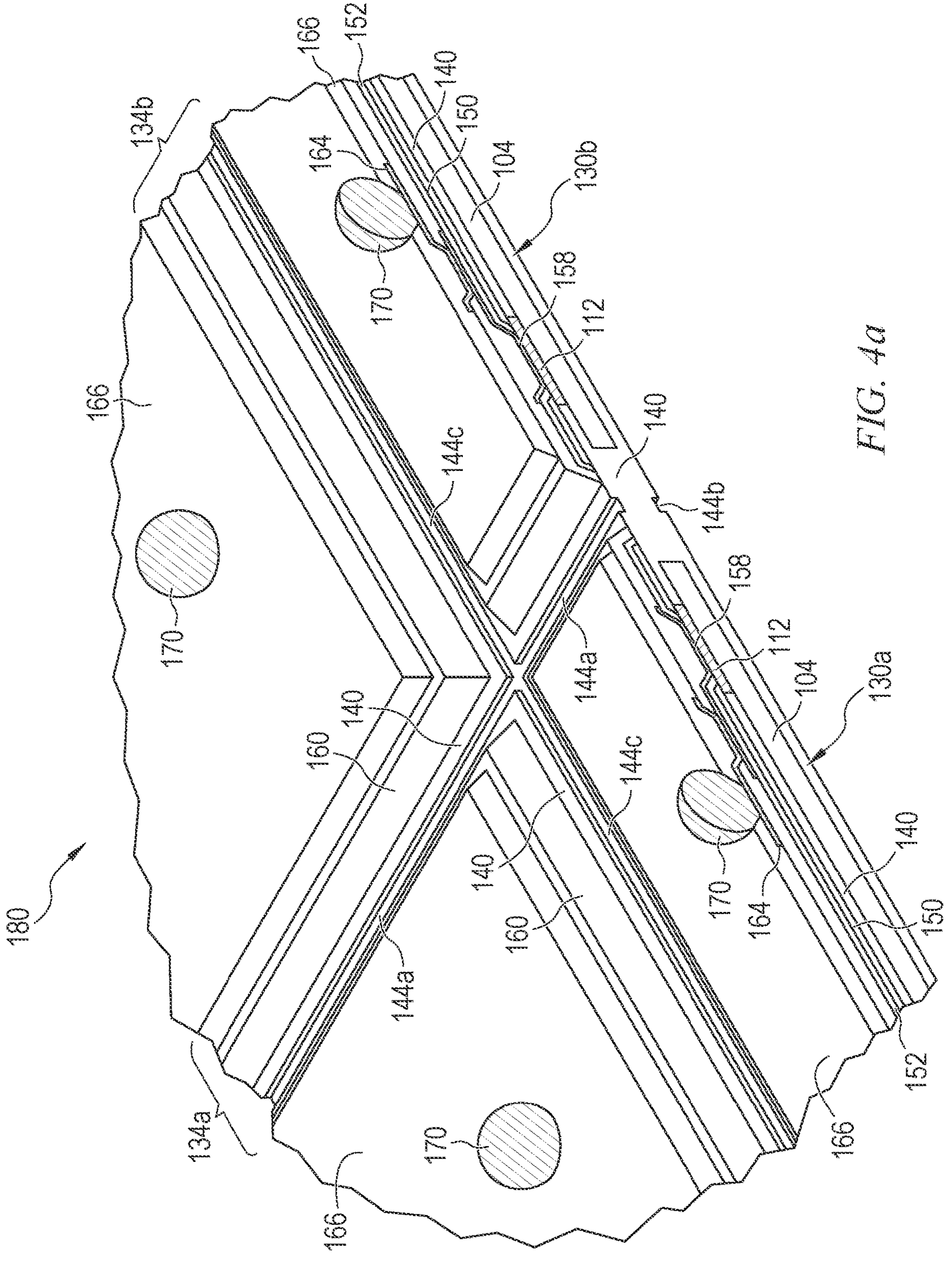
FIGS. 4*a*-4*b* illustrate the channels in the encapsulant of the reconstituted WLP.

FIG. 4*a* is a perspective view of channels 144*a* formed in surface 146 of encapsulant 140 and within saw streets 134*a*, as well as channels 144*b* formed in surface 148 of the encapsulant and within saw streets 134*a* of WLP 180. Accordingly, double-sided channels 144*a* and 144*b* are formed in the opposite surfaces, i.e., top and bottom surfaces, of encapsulant 140. Channels 144*c* are formed in surface 146 of encapsulant 140 and within saw streets 134*b*. Note that insulating layers 160 and 166 terminate close to the package edge and with a distance to channels 144*a* and 144*c*. Thus, saw street 134*a* and 134*b* are exposed without any material filled-in. Channels 144*a*-144*c*, without material filled-in, tend to absorb stress better than the structure of groove filled with dielectric material. Accordingly, channels 144*a*-144*c* provide stress relief to mitigate the thermal stress level due to the thermal coefficient expansion between encapsulant 140 and RDL structures of WLP 180, which is more apparent to constructively contribute to multi-layer RDL and large package unit. The stress relief channels 144*a*-144*c* reduce or eliminate cracking in the multi-layer RDL caused by stress, delamination, and warpage.

Figure 4B:
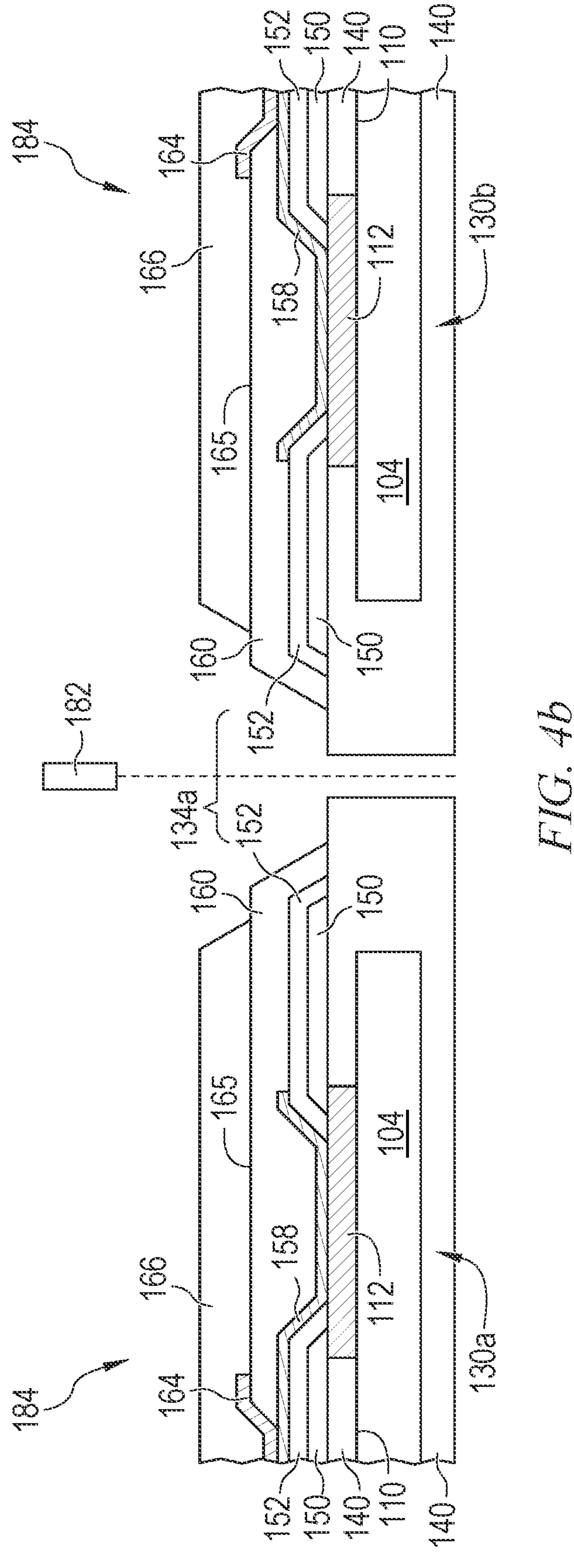

In FIG. 4*b*, after formation of the multi-layer RDL, WLP 180 is singulated through saw streets 134*a* and 134*b* using a saw blade or laser cutting tool 182 into individual semiconductor packages 184. The singulation cuts through channels 144*a*-144*c*, which have already served their stress relief purpose during formation of the multi-layer RDL.

Figure 5:
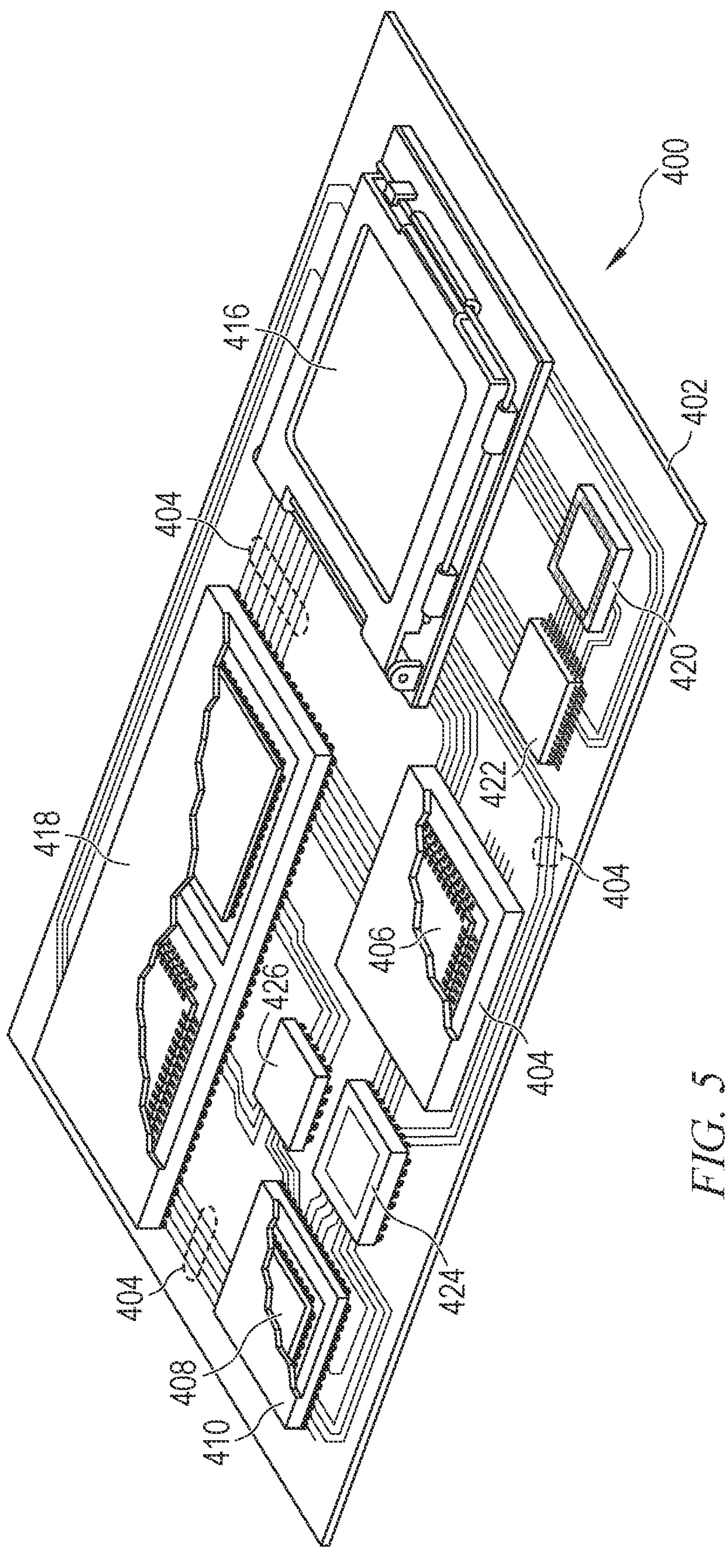
FIG. 5 illustrates a printed circuit board (PCB) with different types of packages disposed on a surface of the PCB.

FIG. 5 illustrates electrical device 400 having a chip carrier substrate or PCB 402 with a plurality of semiconductor packages disposed on a surface of PCB 402, including WLP 180. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:

a plurality of separate electrical components disposed in a spaced-out configuration with a gap between each pair of adjacent electrical components;

an encapsulant deposited over the electrical components with a first saw street of the encapsulant separating a first electrical component of the plurality of electrical components from a second electrical component of the plurality of the electrical components, wherein the encapsulant extends continuously between each of the plurality of electrical components to fill the gaps between each pair of adjacent electrical components, wherein the first saw street is within one of the gaps, and wherein an interconnect structure of each of the electrical components is exposed from the encapsulant; and a first channel formed in a first surface of the encapsulant to extend partially but not completely through the encapsulant within the first saw street to reduce stress; and a second channel formed in a second surface of the encapsulant opposite the first surface and within the first saw street to extend partially but not completely through the encapsulant.

2. The semiconductor device of claim 1, further including a second channel formed in the first surface of the encapsulant and within a second saw street of the encapsulant normal to the first saw street to extend partially but not completely through the encapsulant.

3. The semiconductor device of claim 1, further including a redistribution layer (RDL) formed over the electrical components.

4. The semiconductor device of claim 3, wherein the RDL includes:

an insulating layer formed over the electrical component; and a conductive layer formed over the insulating layer and contacting the interconnect structures of the electrical components.

5. The semiconductor device of claim 4, wherein the insulating layer terminates prior to the first saw street.

6. A semiconductor device, comprising:

a plurality of electrical components disposed with a gap between each pair of adjacent electrical components;

an encapsulant deposited over and directly between the electrical components to fill the gaps between each pair of adjacent electrical components;

a first channel formed in a first surface of the encapsulant to extend partially through the encapsulant within a first saw street of the encapsulant separating the electrical components, wherein the first channel is formed over or in a footprint of a first gap of the gaps; and a second channel formed in a second surface of the encapsulant opposite the first surface and within the first saw street to extend partially through the encapsulant.

7. The semiconductor device of claim 6, further including a second channel formed in the first surface of the encapsulant and within a second saw street of the encapsulant normal to the first saw street to extend partially through the encapsulant.

8. The semiconductor device of claim 7, wherein the second saw street of the encapsulant is normal to the first saw street.

9. The semiconductor device of claim 6, further including a redistribution layer (RDL) formed over the electrical components.

10. The semiconductor device of claim 9, wherein the RDL includes:

an insulating layer formed over the electrical component; and a conductive layer formed over the insulating layer.

11. The semiconductor device of claim 10, wherein the insulating layer terminates prior to the first saw street.

12. A semiconductor device, comprising:

a plurality of electrical components;

an encapsulant deposited over and between the electrical components;

a first channel formed in a first surface of the encapsulant to extend partially through the encapsulant between the electrical components; and a second channel formed in a second surface of the encapsulant opposite the first surface of the encapsulant to extend partially through the encapsulant.

13. The semiconductor device of claim 12, further including a third channel formed in the encapsulant to extend partially through the encapsulant normal to the first channel between the electrical components.

14. The semiconductor device of claim 12, further including a redistribution layer (RDL) formed over the electrical components.

15. The semiconductor device of claim 1, wherein the encapsulant covers both a top surface and a bottom surface of each electrical component.

16. The semiconductor device of claim 15, wherein the encapsulant covers a side surface of each electrical component, and wherein the side surface of each electrical component extends from the top surface to the bottom surface of a respective electrical component.

17. The semiconductor device of claim 1, wherein each of the electrical components is a semiconductor die singulated from a semiconductor wafer.

* * * * *